(12) United States Patent
Kaneda et al.

(10) Patent No.: US 9,362,150 B2
(45) Date of Patent: Jun. 7, 2016

(54) SUBSTRATE PROCESSING APPARATUS

(71) Applicant: TOKYO ELECTRON LIMITED, Tokyo (JP)

(72) Inventors: Masatoshi Kaneda, Koshi (JP); Kazuki Nagamoto, Koshi (JP); Ryo Shimada, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/688,347

(22) Filed: Apr. 16, 2015

(65) Prior Publication Data

US 2015/0303077 A1 Oct. 22, 2015

(30) Foreign Application Priority Data

Apr. 18, 2014 (JP) ................................. 2014-086246

(51) Int. Cl.
*H01L 21/67* (2006.01)
*H01L 21/677* (2006.01)
*H01L 21/683* (2006.01)

(52) U.S. Cl.
CPC .... *H01L 21/67115* (2013.01); *H01L 21/67748* (2013.01); *H01L 21/6838* (2013.01)

(58) Field of Classification Search
USPC .................................................. 118/50–503
See application file for complete search history.

(56) References Cited

U.S. PATENT DOCUMENTS

| 5,645,419 | A   | * | 7/1997  | Ohsawa | ............ | H01L 21/67115 |
|-----------|-----|---|---------|--------|--------------|---------------|
|           |     |   |         |        |              | 432/241       |
| 6,511,575 | B1  | * | 1/2003  | Shindo | .................. | B08B 7/0035 |
|           |     |   |         |        |              | 204/298.34    |
| 8,852,966 | B2  | * | 10/2014 | Kiyama | .............. | H01L 21/2686  |
|           |     |   |         |        |              | 257/E21.211   |
| 2006/0240680 | A1 | * | 10/2006 | Yokota | .............. | H01L 21/67115 |
|           |     |   |         |        |              | 438/800       |

FOREIGN PATENT DOCUMENTS

| JP | 2013-232611 A | 11/2013 |
|----|---------------|---------|
| JP | 2014-027228 A | 2/2014  |

* cited by examiner

*Primary Examiner* — Phillip A Johnston
(74) *Attorney, Agent, or Firm* — Nath, Goldberg & Meyer; Jerald L. Meyer

(57) ABSTRACT

A substrate processing apparatus includes a housing, a mounting table provided in the housing and configured to mount a substrate thereon, a drive mechanism provided below the mounting table so as to move the mounting table in a front-back direction between a delivering/receiving location for the substrate and a processing chamber, an ultraviolet irradiation unit configured to irradiate the substrate in the processing chamber with ultraviolet rays, a partition member provided to partition the processing chamber and a drive chamber with the drive mechanism positioned therein up and down, the partition member having a slit for allowing movement of a support supporting the mounting table, first exhaust ports formed in the drive chamber to exhaust an atmosphere in the drive chamber, and second exhaust ports formed along a lengthwise direction of the slit so as to face the slit.

15 Claims, 14 Drawing Sheets

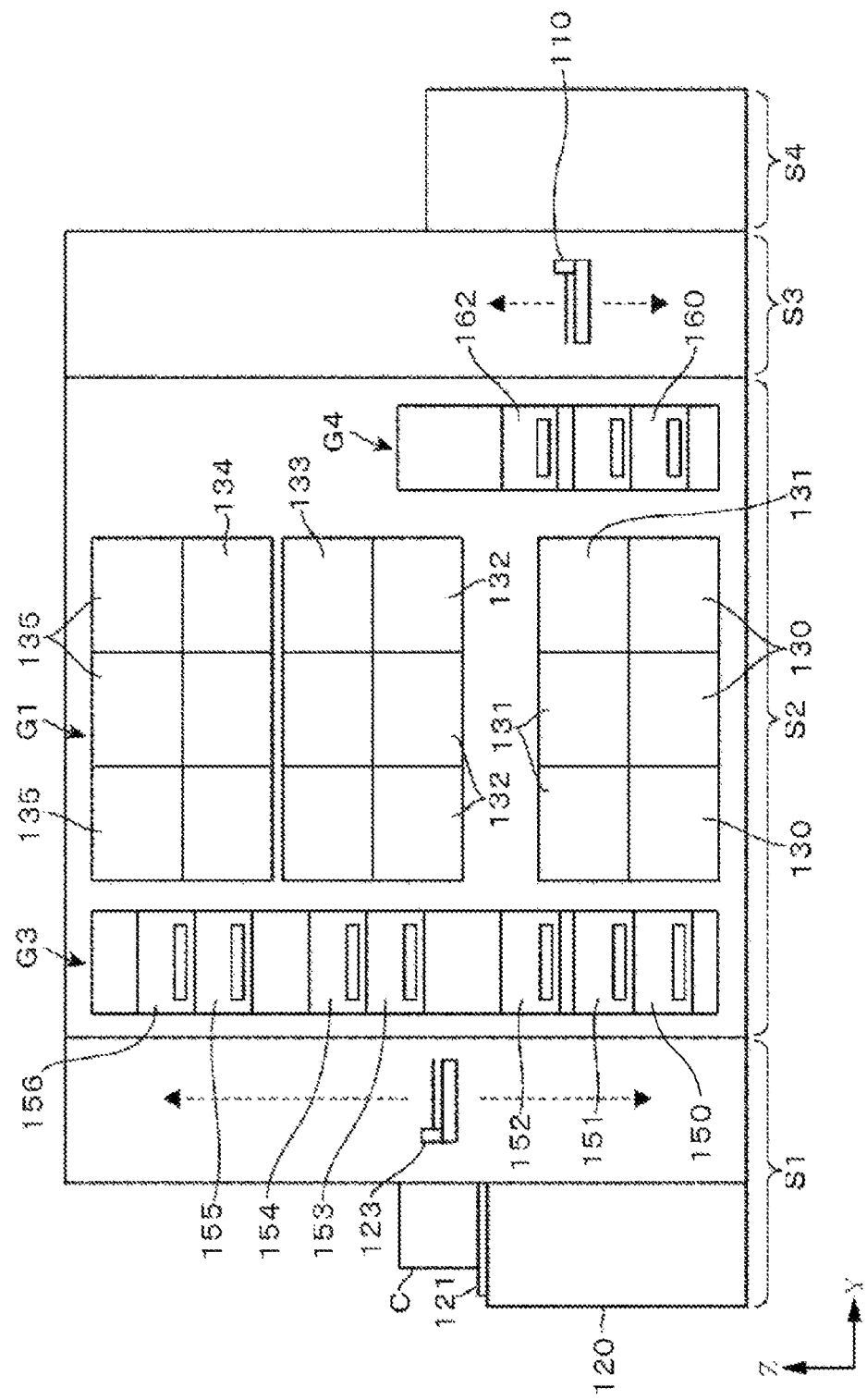

000# SUBSTRATE PROCESSING APPARATUS

CROSS-REFERENCE TO RELATED APPLICATION

This application claims the benefit of Japanese Patent Application No. 2014-086246, filed on Apr. 18, 2014, in the Japan Patent Office, the disclosure of which is incorporated herein in its entirety by reference.

TECHNICAL FIELD

The present disclosure relates to a substrate processing apparatus for performing processing by irradiating a substrate with ultraviolet rays.

BACKGROUND

In a process of manufacturing a semiconductor device, a step of irradiating a substrate with ultraviolet rays to perform a desired process (e.g. a peripheral exposure for exposing a periphery of a substrate to light) on the substrate has been used. Various new methods have also been proposed for techniques of forming a pattern on a substrate. Among the series of methods, a new technique using ultraviolet rays has been proposed. For example, these methods include a process of irradiating the entire surface of a resist film on a substrate with ultraviolet rays, thereby modifying the resist film, a method of irradiating a block polymer composed of two kinds of polymers with ultraviolet rays and subsequently developing the block polymer, thereby forming a line pattern, and the like.

Considering a need for simplification of the configuration of an apparatus when substrate processing is performed using ultraviolet rays as described above, incorporation of air is not avoidable even when an inert gas atmosphere is used as a processing atmosphere, and thus ozone is generated. For this reason, there is a concern that the generated ozone may be problematic. Conventionally, an example of effective configurations of processing apparatuses using ultraviolet rays includes a configuration for mounting a substrate on a mounting table and passing the mounting table below an ultraviolet ray irradiation unit. However, there is a concern that a drive system for the mounting table may be corroded by ozone.

In consideration of this, in a substrate processing apparatus using ultraviolet rays, it is required to suppress corrosion of a drive system caused by ozone, while inhibiting particles from the drive system from adhering to a substrate. It is also required to suppress the incorporation of air when an inert gas atmosphere is used as the processing atmosphere.

SUMMARY

Some embodiments of the present disclosure were conceived under such circumstances and directed to provide a substrate processing apparatus using ultraviolet rays, which can suppress an adverse effect on a drive mechanism caused by ozone and reduce the amount of particles adhering to a substrate.

According to one embodiment of the present disclosure, there is a substrate processing apparatus including a housing, a mounting table provided in the housing and configured to mount a substrate thereon, a drive mechanism provided below the mounting table so as to move the mounting table in a front-back direction between a delivering/receiving location for the substrate and a processing chamber, an ultraviolet irradiation unit configured to irradiate the substrate in the processing chamber with ultraviolet rays, a partition member provided to partition the processing chamber and a drive chamber with the drive mechanism positioned therein up and down, the partition member having a slit for allowing movement of a support supporting the mounting table, first exhaust ports formed in the drive chamber to exhaust an atmosphere in the drive chamber, and second exhaust ports formed along a lengthwise direction of the slit so as to face the slit.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 14 is a second longitudinal sectional side view of the coating and developing apparatus.

DETAILED DESCRIPTION

Figure 1:
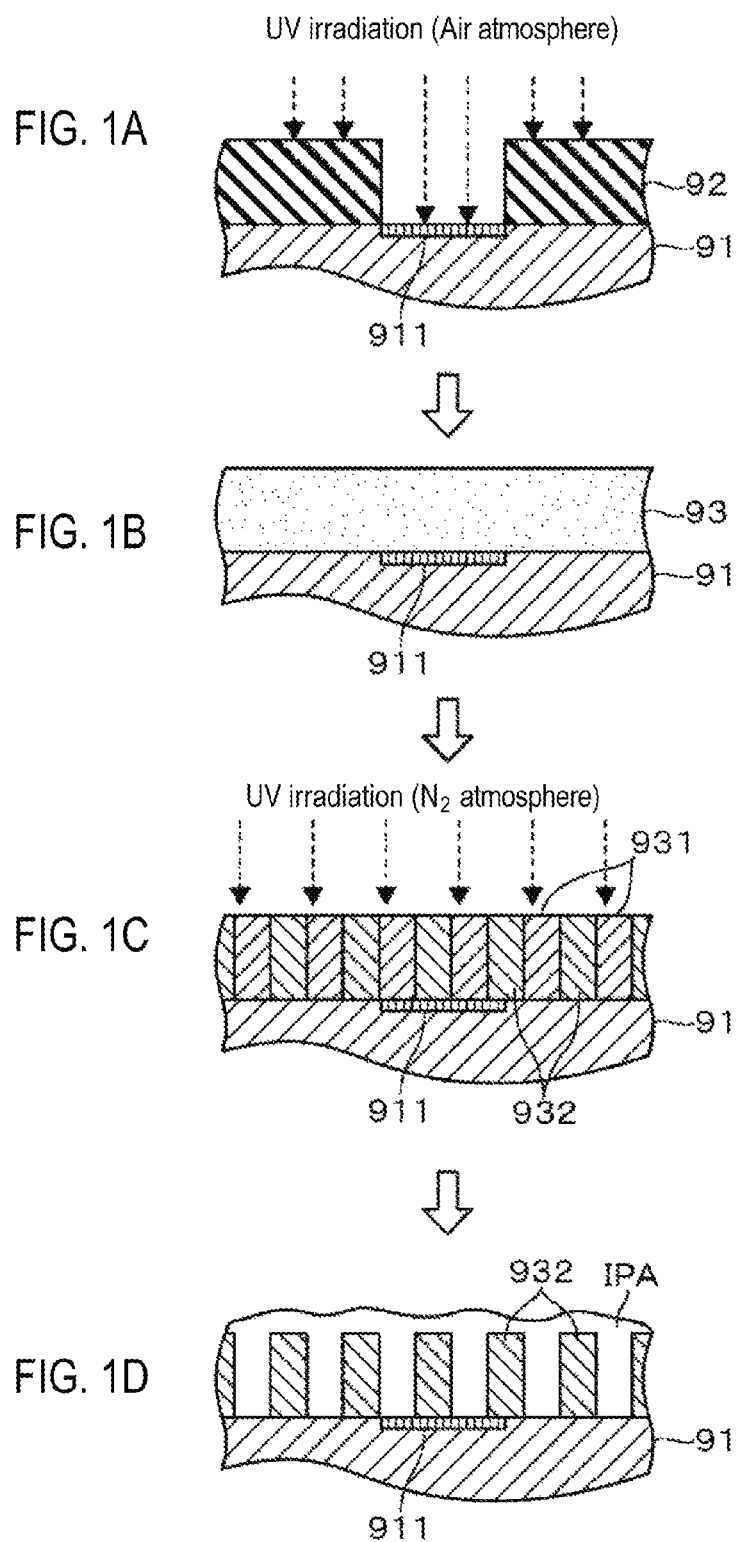
FIGS. 1A to 1D are views illustrating a process according to an example of a method of forming a pattern using DSA.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, a specific example of processing performed on a wafer W using an atmospheric UV processing module 141 and a nitric UV processing module 144 that are substrate processing apparatuses of the present disclosure will be described with reference to FIGS. 1A to 14.

The atmospheric UV processing module 141 and the nitric UV processing module 144, which will be described later, are employed at a process of forming a pattern on a wafer W using directed self assembly (DSA) of block copolymers (BCPs).

Specifically, the nitric UV processing module 144 is used in a process of coating BCP on a surface of a wafer W to form a BCP film 93 and performing a process of irradiating the BCP film 93 with ultraviolet rays under the atmosphere of nitrogen that is an inert gas (nitric UV (ultraviolet) process), thereby controlling solubility of a phase-separated pattern to a solvent.

Furthermore, in the following embodiment, an example will be described in which BCPs including a hydrophilic polymer block and a hydrophobic polymer block are used and affinity of hydrophilic regions 911, which are formed in a lower neutral film 91, with hydrophilic polymer portions 931 after phase separation is used, in order to perform control for a position where a pattern is to be formed. In this example, the atmospheric UV processing module 141 is used in processing of forming the hydrophilic regions 911 in the neutral film 91 by irradiating the neutral film 91 with ultraviolet rays under an air atmosphere (atmospheric UV processing).

The processing flow of forming a pattern from BCPs while performing the processing of irradiating a wafer W with ultraviolet rays (UV processing) as described above will be described with reference to FIGS. 1A to 1D.

FIG. 1A shows a state of forming a neutral film 91 having intermediate affinity with respect to both the hydrophilic polymer portions 931 and hydrophobic polymer portions 932 which are formed by the phase separation of BCPs on a top surface of a wafer W. A resist film 92 in which an opening is formed at a position to form the hydrophilic region 911 is patterned on an upper side of the neutral film 91. When the atmospheric UV process is performed on the wafer W, the surface of the neutral film 91 is oxidized to thereby form the hydrophilic region 911.

After the formation of the hydrophilic regions 911, the resist film 92 is removed and BCPs are coated to form a BCP film 93 (FIG. 1B). Then, heat treatment is performed by heating the wafer W having the BCP film 93 formed thereon. A hydrophilic polymer block and a hydrophobic polymer block are phase-separated by the heat treatment to form a lamella structure of the hydrophilic polymer portions 931 and the hydrophobic polymer portions 932 (a structure in which the hydrophilic polymer portions 931 and the hydrophobic polymer portions 932 extending straight in a direction perpendicular to the plane of the figure are alternately disposed). At this time, each of the hydrophilic regions 911 is formed at a predetermined position on the wafer W, so that the hydrophobic polymer portion 932 is disposed at a central portion of the hydrophilic region 911. The hydrophilic polymer portions 931 are disposed on both sides of the hydrophobic polymer portion 932 positioned at the central portion and functioning as a reference point, and the hydrophobic polymer portions 932 are also disposed on both sides of the hydrophilic polymer portion 931. Thus, the hydrophobic polymer portions 932 and the hydrophilic polymer portions 931 can be alternately disposed at desired positions and in a desired order (FIG. 1C).

If a nitric UV process is further performed on the wafer W on which the hydrophilic polymer portions 931 and the hydrophobic polymer portions 932 are formed (FIG. 1C), for example, it becomes difficult to dissolve the hydrophobic polymer portions 932 in a solvent due to progression of crosslink reactions of the hydrophobic polymer portions 932, whereas it becomes easy to dissolve the hydrophilic polymer portions 931 in the solvent due to progression of a reaction of cutting a main chain of a polymer. Thereafter, the hydrophilic polymer portions 931 are dissolved and removed by supplying an organic solvent such as IPA (isopropyl alcohol) onto the surface of the wafer W, so that it is possible to obtain a pattern of the hydrophobic polymer portions 932 in the shape of straight lines and disposed at a predetermined interval (FIG. 1D). The hydrophobic polymer portions 932 are etched with a mask pattern, so that a pattern structure corresponding to the mask pattern can be formed on the wafer W.

For the method of forming the pattern using the DSA of BCPs as outlined above, in the atmospheric UV processing module 141 or the nitric UV processing module 144 of this example, a wafer W is mounted on a vacuum chuck 5 constituting the mounting table, and UV processing is performed by passing the wafer W into an lower side of an ultraviolet lamp 7, which is an ultraviolet irradiation unit, within a processing chamber 20. The atmospheric UV processing module 141 and the nitric UV processing module 144 are configured to be capable of inhibiting ozone generated in UV processing from entering a drive chamber 22 in which a drive mechanism for the vacuum chuck 5 is accommodated, and also inhibiting particles generated in the drive chamber 22 from entering the processing chamber 20.

Hereinafter, configurations and operations of the atmospheric UV processing module 141 and the nitric UV processing module 144 will be sequentially described.

The atmospheric UV processing module 141 according to a first embodiment of the present disclosure will be described with reference to FIGS. 2 to 7. In describing the atmospheric UV processing module 141 and the nitric UV processing module 144 with reference to FIGS. 2 to 11, a left side when viewing the figures will be referred to as a front side.

Figure 3:
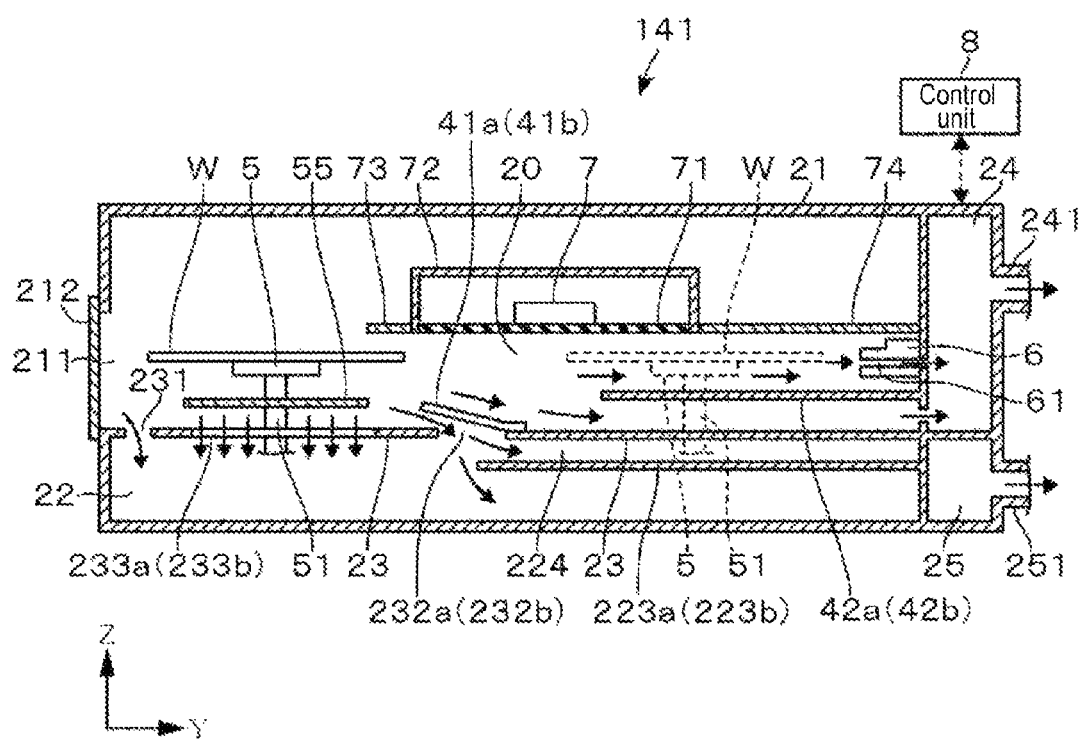
FIG. 3 is a longitudinal sectional side view of the atmospheric UV processing module.

In the atmospheric UV processing module 141, as shown in the longitudinal sectional side view of FIG. 3, the interior of a flat housing 21, which is thin and elongated in a front-back direction, is partitioned into upper and lower parts by a partition member 23. A delivering/receiving location or a processing chamber 20 for a wafer W is provided above the partition member 23, and a drive chamber 22 accommodating a drive mechanism of a vacuum chuck 5 therein is provided below the partition member 23.

A carrying in/out hole 211 for carrying the wafer W in or out of an upper space of the partition member 23 is formed at a sidewall of a front side of the housing 21. The carrying in/out hole 211 is configured to be opened and closed by a shutter 212.

Figure 2:
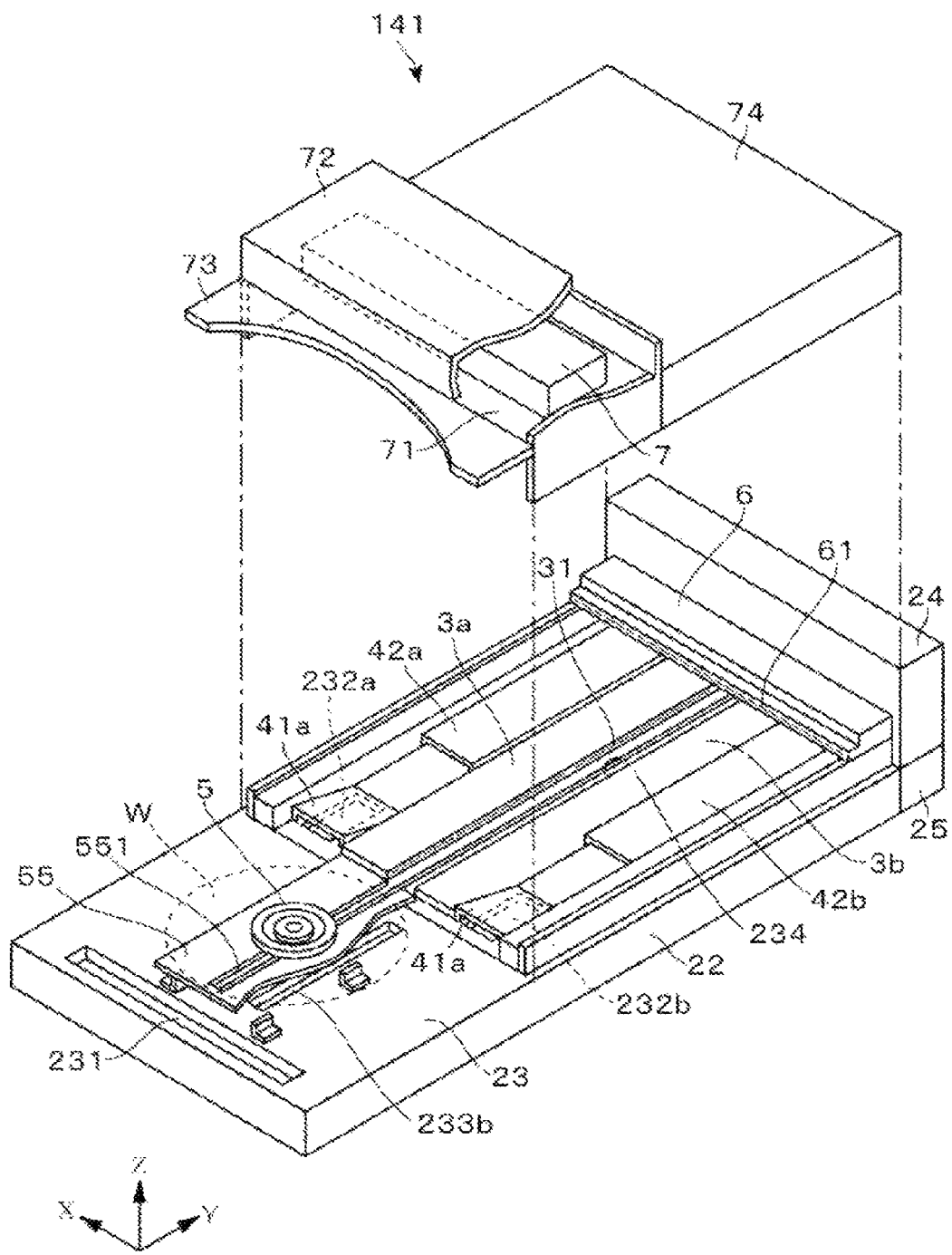
FIG. 2 is an exploded perspective view of an atmospheric UV processing module used to form a hydrophilic region.

As shown in FIGS. 2 and 3, a space for delivering and receiving the wafer between an external wafer transfer mechanism 170 (FIG. 12, etc.) and the vacuum chuck 5 (the delivering/receiving location) is formed at a front region in the housing 21 that faces the carrying in/out hole 211. The vacuum chuck 5 is a disk-shaped member on which the wafer W is mounted, and an suction hole connected to a vacuum evacuation passage (not shown) is opened on the top surface of the vacuum chuck 5 so as to suck and hold the wafer W.

The vacuum chuck 5 is connected to the drive mechanism, which will be described later, through a support 51, and a slit 234, in the form of a straight line, is formed in the partition member 23 so as to constitute a movement path for moving the support 51. Thus, the vacuum chuck 5 can move in the front-back direction along the slit 234 between the delivering/receiving location for the wafer W and the processing chamber 20.

Figure 5:
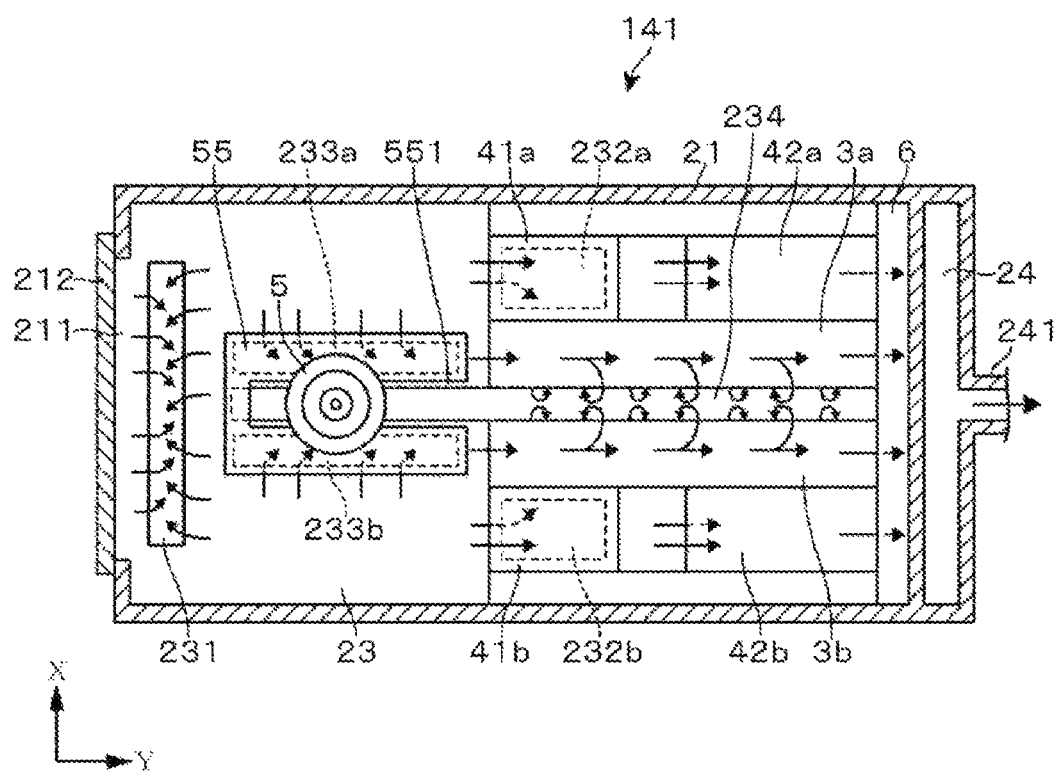
FIG. 5 is a first cross-sectional plan view of the atmospheric UV processing module.

As shown in FIG. 2, FIG. 5 and the like, a front-side opening 231 for sucking air entering from the carrying in/out hole 211 downwardly toward the interior of the drive chamber 22 is formed in the partition member 23 located to be interposed between the carrying in/out hole 211 and the vacuum chuck 5 that has been moved to the delivering/receiving location. The front-side opening 231 is formed in a narrow shape elongated in left and right directions along the carrying in/out hole 211.

Figure 6:
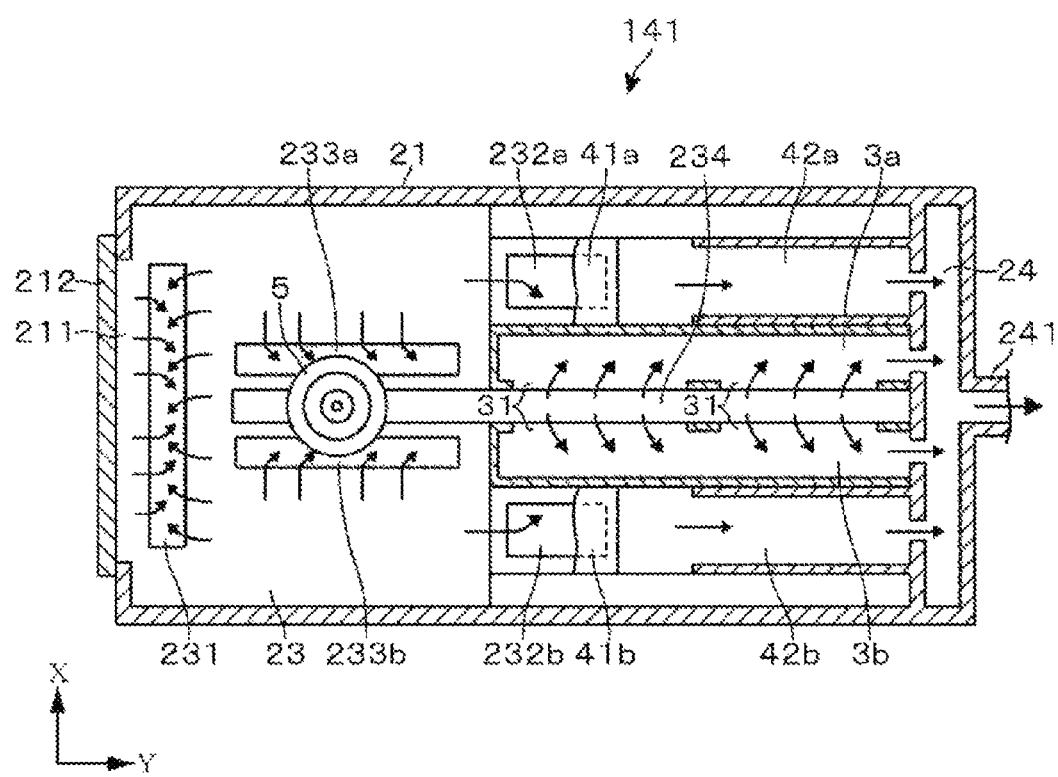
FIG. 6 is a second cross-sectional plan view of the atmospheric UV processing module.

Moreover, delivering/receiving location-side openings 233a and 233b for sucking air in the delivering/receiving space for the wafer W downwardly toward the interior of the drive chamber 22 are formed in the partition member 23 on both left and right sides of the slit 234 when viewed from the front side (see FIG. 2, FIG. 6 and the like). The delivering/receiving location-side openings 233a and 233b are formed in a narrow shape elongated in the front-back direction along the direction in which the slit 234 extends.

The above-described front-side opening 231 or delivering/receiving location-side openings 233a and 233b correspond to a third opening in this embodiment. The third opening is provided to independently perform evacuation for the space in which the wafer W is delivered and received from evacuation for the processing chamber 20, thereby reducing the amount of evacuation in the processing chamber 20.

In addition, as shown in FIG. 2, FIG. 3 and the like, a cover 55 for covering the delivering/receiving location-side openings 233a and 233b is provided above the delivering/receiving location-side openings 233a and 233b in order to inhibit particles generated in the drive chamber 22 from adhering to the wafer W mounted on the vacuum chuck 5. The cover 55 is installed at a level between the delivering/receiving location-side openings 233a and 233b and the mounting surface of the wafer W on the vacuum chuck 5. The air in the delivering/receiving space for the wafer W enters the delivering/receiving location-side openings 233a and 233b through a gap between the cover 55 and the partition member 23. The cover 55 is also formed with a slit 551 for allowing the support 51 supporting the vacuum chuck 5 to pass therethrough.

As shown in FIG. 2, FIG. 3 and the like, a lamp box 72 and a processing chamber cover 74 are provided at the rear side of the delivery/receipt space for the wafer W so as to cover an upper portion of the partition member 23. The wafer W mounted on the vacuum chuck 5 is carried into the processing chamber 20 surrounded by the partition member 23, the lamp box 72 and the processing chamber cover 74.

An ultraviolet lamp 7, such as a low-pressure ultraviolet lamp (low-pressure mercury lamp) emitting ultraviolet rays having a strong peak at wavelengths of 185 nm and 254 nm, a Xe excimer lamp emitting ultraviolet rays of a single wavelength of 172 nm, or a KrCl excimer lamp emitting ultraviolet rays of a single wavelength of 222 nm, is disposed in the lamp box 72. The ultraviolet lamp 7 is configured to irradiate a linear region longer than the diameter (e.g., 300 mm) of the wafer W with the ultraviolet rays and is disposed such that the irradiated linear region is formed in a direction which is perpendicular to the movement direction of the wafer W (the extending direction of the slit 234).

A quartz glass 71 allowing ultraviolet rays to be transmitted therethrough is disposed at the bottom surface of the lamp box 72, and ultraviolet rays generated by supplying electric power to the ultraviolet lamp 7 from a power supply (not shown) are irradiated downward through the quartz glass 71. The wafer W passes below the ultraviolet lamp 7 to thereby perform atmospheric UV processing in which the wafer W is irradiated with ultraviolet rays under an air atmosphere.

The processing chamber cover 74 covers the upper portion of the partition member 23 in a region posterior to the position where the lamp box 72 is disposed, thereby forming the processing chamber 20 together with the lamp box 72 between the processing chamber cover 74 and the partition member 23.

As shown in FIG. 2, a covering portion 73 is provided at the front of the lamp box 72.

Subsequently, a configuration in the drive chamber 22 at the lower side of the partition member 23 will be described with reference to FIGS. 3, 4 and 7.

Figure 4:
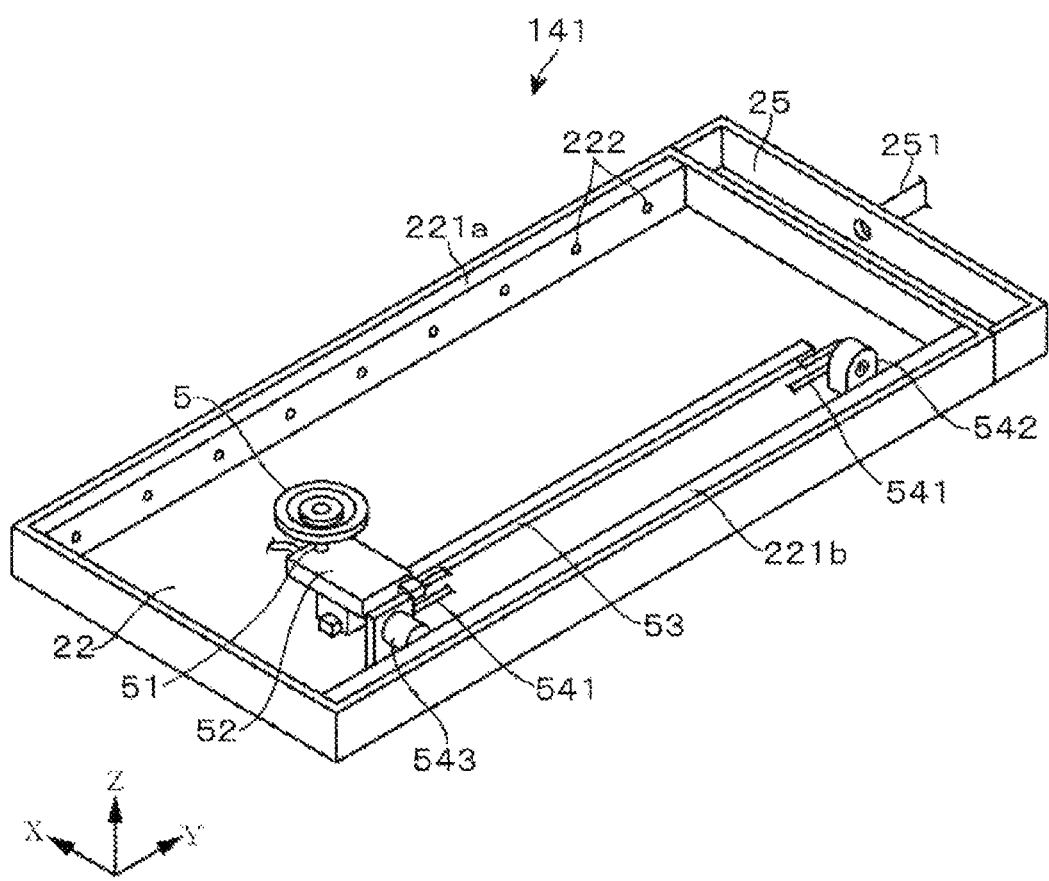
FIG. 4 is an exploded perspective view showing an internal configuration of a drive chamber of the atmospheric UV processing module.

As shown in FIG. 4, a slider 52 is provided at a lower end of the support 51 supporting the vacuum chuck 5. The slider 52 is configured to be guided by a rail 53 disposed above a bottom surface of the drive chamber 22 along the aforementioned direction in which the slit 234 extends to be movable in the front-back direction within the drive chamber 22.

The slider 52 is also connected to a drive belt 541, and the drive belt 541 is wrapped around a rotating shaft of a rotary motor 543 and a pulley 542 which are respectively disposed at front and rear ends of the rail 53. The drive belt 541 is rotated by rotating the rotary motor 543 by a predetermined amount in a forward or reverse rotation direction to move the slider 52 in the front-back direction, so that the vacuum chuck 5 can be moved to a desired position.

The slider 52, the rail 53, the drive belt 541 or rotary motor 543, and the pulley 542 correspond to the drive mechanism of the vacuum chuck 5. For convenience of illustration, FIG. 4 shows the drive belt 541 in a state where the drive belt 541 is cut away.

Figure 7:
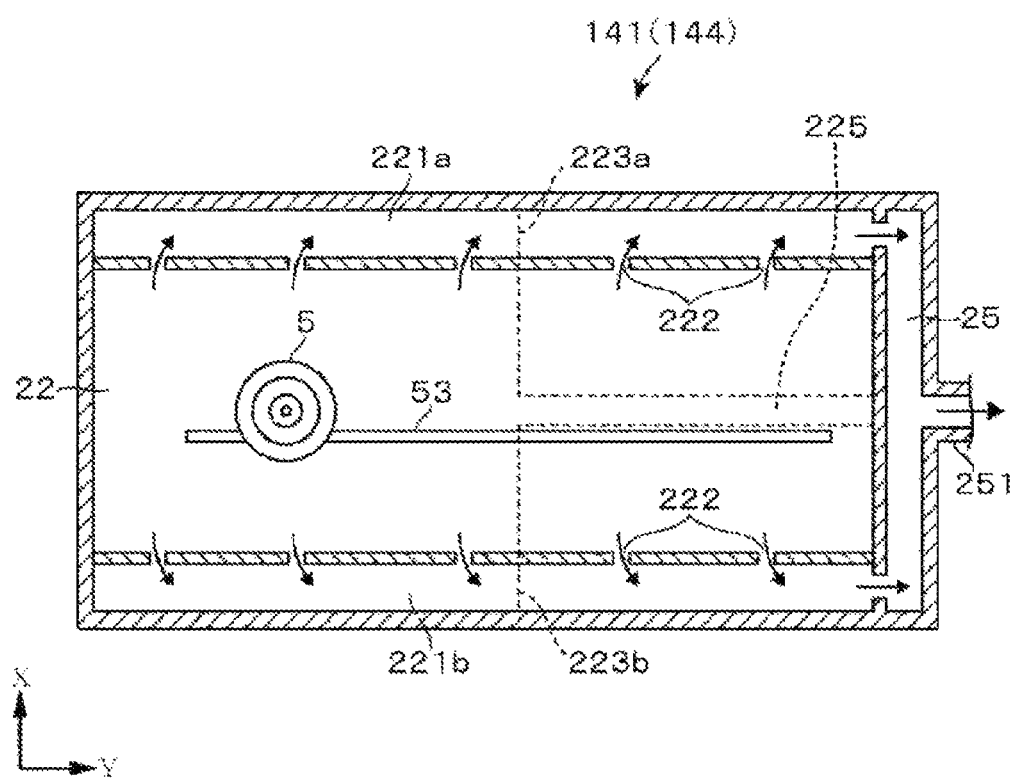
FIG. 7 is a cross-sectional plan view of the drive chamber.
Figure 8:
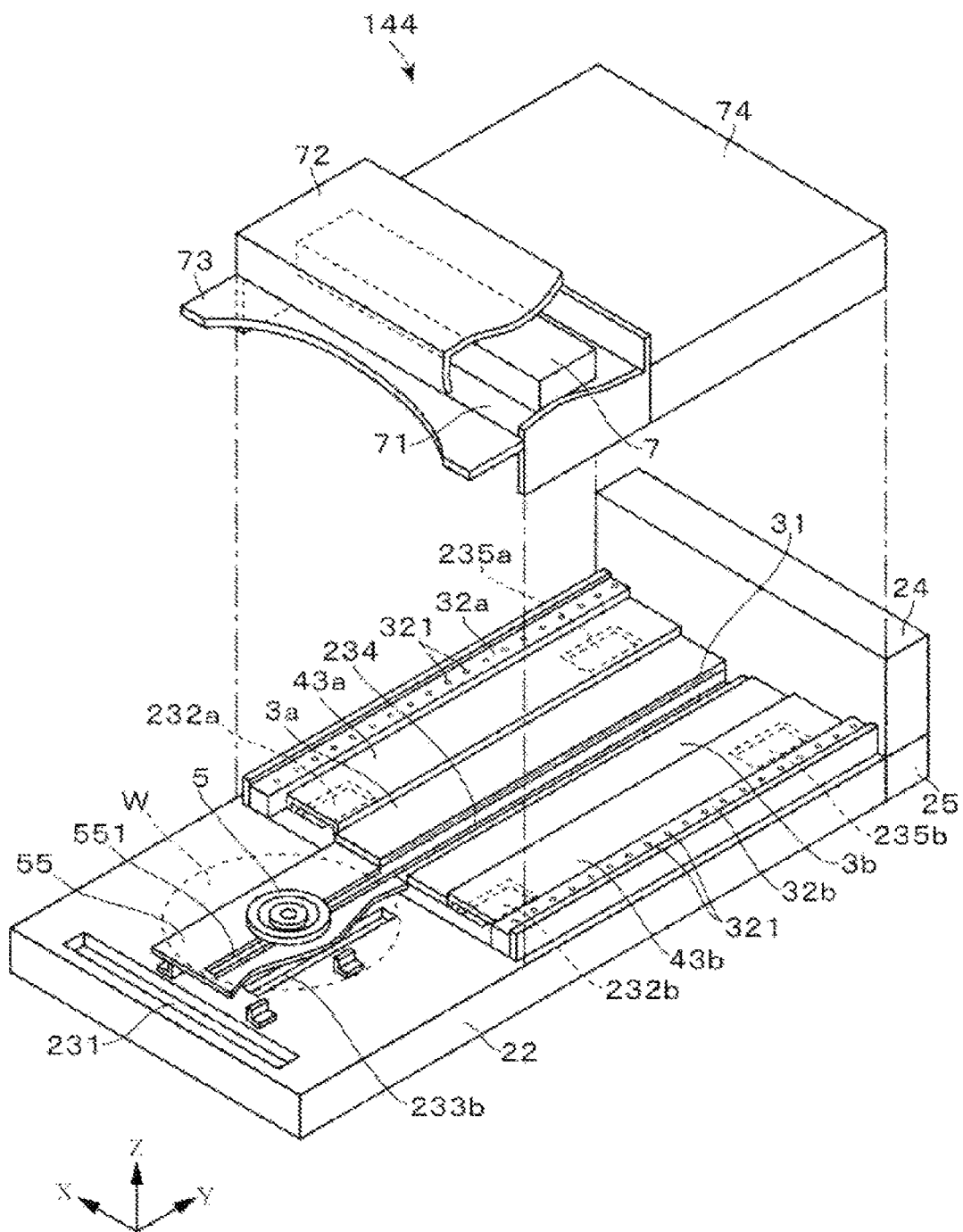
FIG. 8 is an exploded perspective view of a nitric UV processing module used in processing of hydrophilic/hydrophobic polymer portions.

As shown in FIGS. 4 and 7, exhaust pipes 221a and 221b are provided in the drive chamber 22 to extend in the front-back directions along left and right inner wall surfaces of the drive chamber 22 when viewed from the front side. A plurality of exhaust holes 222 are formed at a predetermined interval in a side surface of each of the exhaust pipes 221a and 221b, and the atmosphere in the drive chamber 22 is exhausted into the exhaust pipes 221a and 221b through the exhaust holes 222. Therefore, the exhaust holes 222 are formed on both the left and right sides of the slit 234.

The exhaust holes 222 correspond to first exhaust ports for exhausting the atmosphere in the drive chamber 22.

As shown in FIG. 7, each of the exhaust pipes 221a and 221b is connected to a lower-side exhaust chamber 25 provided at the rear side of the drive chamber 22. Air streams flowing in the exhaust pipes 221a and 221b are exhausted through the lower-side exhaust chamber 25 to a lower-side exhaust line 251 connected to the lower-side exhaust chamber 25 and then exhausted to the outside.

The atmospheric UV processing module 141 having the configuration described above performs specific exhaust to prevent ozone generated in the processing chamber 20 from entering the drive chamber 22 and prevent particles generated in the drive chamber 22 from entering the processing chamber 20. Hereinafter, a configuration for evacuating the processing chamber 20 will be described.

As shown in FIGS. 2, 6 and the like, slit-side ducts 3a and 3b, each of which has an exhaust port 31 formed along a lengthwise direction of a slit 243 constituting the movement path of the support 51 supporting the vacuum chuck 5, are provided onto the partition member 23 on both left and right sides of the slit 234 in the processing chamber 20. The exhaust ports 31 formed in both the slit-side ducts 3a and 3b are provided in surfaces of the ducts opposite to each other on both the left and right sides of the slit 234.

As shown in FIG. 6, rear ends of the respective slit-side ducts 3a and 3b are connected to an upper-side exhaust chamber 24 provided at the rear side of the processing chamber 20. Air streams flowing in the slit-side ducts 3a and 3b are exhausted through the upper-side exhaust chamber 24 to an upper-side exhaust line 241 connected to the upper-side exhaust chamber 24 and then exhausted to the outside.

The exhaust ports 31 formed in the respective slit-side ducts 3a and 3b correspond to second exhaust ports.

Processing chamber-side openings 232a and 232b of a rectangular shape, which communicate with the drive chamber 22, are formed in the partition member 23 located at the front side of the processing chamber 20 facing the delivering/receiving space for the wafer W on a left side of the slit-side duct 3a and a right side of the slit-side duct 3b, respectively, when viewed from the front side. These processing chamber-side openings 232a and 232b are covered by guide plates 41a and 41b, which is inclined such that their heights gradually increase to leading ends from trailing ends connected to the partition member 23.

A gap between the respective guide plates 41a and 41b and the partition member 23 are opened at a position facing the delivering/receiving space for the wafer W from the processing chamber 20, and some of the air entering the processing chamber 20 from the space flows toward the drive chamber 22. The gap between the guide plates 41a and 41b and the partition member 23 corresponds to a second opening of this embodiment.

Here, the shape of each of the processing chamber-side openings 232a and 232b is not limited to a rectangular shape, and a configuration formed by arranging a plurality of small holes in the partition member 23 may be employed, for example. In addition, it is not required that the guide plates 41a and 41b cover the upper side of the processing chamber-side openings 232a and 232b, and the processing chamber-side openings 232a and 232b may be formed by being exposed to the partition member 23. In this case, the processing chamber-side openings 232a and 232b themselves become the second openings.

Exhaust ducts 42a and 42b are formed, on the partition member 23 posterior to the processing chamber-side openings 232a and 232b, to extend in the front-back direction along the slit 234 or the slit-side ducts 3a and 3b. Leading ends of the exhaust ducts 42a or 42b constitute third exhaust ports that are opened to the region in which the irradiation of ultraviolet rays from the ultraviolet lamp 7 is performed in the processing chamber 20, whereas trailing ends of the exhaust ducts 42a and 42b are opened to the upper-side exhaust chamber 24 previously described above. Furthermore, an opening may be formed in the partition member 23 at a trailing end of each of the exhaust ducts 42a and 42b, so that the interior of each of the exhaust ducts 42a and 42b may be exhausted to the drive chamber 22.

In addition, a rear-side exhaust part 6 that is formed with a slit-shaped exhaust port 61 extending in the lateral direction when viewed from the front side is provided on the rearmost wall of the processing chamber 20 (FIGS. 2 and 3). The exhaust port 61 is also connected to the upper-side exhaust chamber 24 previously described above.

In this embodiment, the rear end of the processing chamber 20 and the rear ends of the exhaust ducts 42a and 42b are opened toward the upper-side exhaust chamber 24, respectively, but either of the processing chamber 20 and the exhaust ducts 42a and 42b may be opened toward the upper-side exhaust chamber 24. When exhaust is performed only from the rear end of the processing chamber 20, the processing chamber 20 itself may be considered to constitute the exhaust duct in the present disclosure.

As shown in FIGS. 3 and 7 (indicated by a dashed line in FIG. 7), plate-shaped buffer space forming members 223a and 223b are disposed below the partition member 23 in the side of the processing chamber 20 in a spaced-apart relationship with the bottom surface of the partition member 23.

As described above, the interior of the drive chamber 22 is a space in which the support 51 or the slider 52 of the vacuum chuck 5 moves in the front-back direction, and the atmosphere in the drive chamber 22 is mixed due to the movements of the members 51 and 52. As a result, there is a concern in that particles generated in the drive chamber 22 may rise and then flow into the processing chamber 20 through the slit 234 or the like.

Accordingly, the buffer space forming members 223a and 223b are disposed below the partition member 23 to form the gap between the partition member 23 and the buffer space forming members 223a and 223b. The gap is employed as a buffer space 224. Front ends of the buffer space forming members 223a and 223b are positioned below a central portion in the front-back direction of the processing chamber-side openings 232a and 232b previously described above, and rear ends of the buffer space forming members 223a and 223b are connected to the sidewall at the rear end of the drive chamber 22. As shown in FIG. 7, when viewed from the front side, a left side end of the buffer space forming member 223a and a right side end of the buffer space forming member 223b are connected to sidewalls of the drive chamber 22, respectively. Meanwhile, a right side end of the buffer space forming member 223a and a left side end of the buffer space forming member 223b extend to lower portions of the partition member 23 defining the slit 234, thereby configuring a slit 225 having a width almost equal to that of the slit 234.

The atmospheric UV processing module 141 configured as described above is connected to a control unit 8 (FIG. 3). The control unit 8 includes a computer having a CPU and a memory, which are not shown in the figure, and the memory stores a program composed of a group of steps (instructions) related to control for performing the operations of the atmospheric UV processing module 141, i.e., loading a wafer W mounted on the vacuum chuck 5 into the processing chamber 20, irradiating the wafer W with ultraviolet rays from the ultraviolet lamp 7 to perform atmospheric UV processing, then moving the wafer W back to the delivering/receiving location, and unloading the wafer to the outside. The program is stored in a recording medium such as a hard disk, a compact disk, a magneto-optical disk, a memory card, or the like and is installed therefrom into the computer.

Subsequently, the operations of the atmospheric UV processing module 141 will be described. When a wafer W to be processed is transferred by the external wafer transfer mechanism 170, the shutter 212 is opened and the wafer W is transferred through the carrying in/out hole 211 and mounted on the vacuum chuck 5 that is on standby in the delivering/receiving space. When the wafer W is sucked and held by the vacuum chuck 5, the ultraviolet lamp 7 is supplied with electric power to initiate irradiation of ultraviolet rays and simultaneously the wafer W is moved toward the processing chamber 20.

When the wafer W enters the processing chamber 20 and passes below the ultraviolet lamp 7, a top surface of the wafer W is irradiated with ultraviolet rays. The wafer W is moved below the ultraviolet lamp 7 at a predetermined speed as described above, thereby scanning the entire surface of the wafer W with the ultraviolet rays. Therefore, the atmospheric UV processing illustrated in FIG. 1A is performed.

When the irradiation of the entire surface of the wafer W with the ultraviolet rays is finished, the ultraviolet lamp 7 is turned off and the wafer W is moved to the delivering/receiving space. Thereafter, the shutter 212 is opened and the wafer transfer mechanism 170 enters therethrough, and the wafer W is released from its state of being sucked and held by the vacuum chuck 5 and is transferred to the wafer transfer mechanism 170. The completely processed wafer W is then unloaded.

The flow of a gas in the atmospheric UV processing module 141 during the operations will be described. The plan view of FIG. 6 shows a state where some portions of the guide plates 41a and 41b shown in FIG. 5 or top surfaces of the exhaust ducts 42a and 42b and the slit-side ducts 3a and 3b are removed.

As shown in FIGS. 3, 5 and the like, air flowing from the outside through the carrying in/out hole 211 upon carrying-in/carrying-out of the wafer W is exhausted into the drive chamber 22 through the front-side opening 231 provided at a position facing the carrying in/out hole 211. Air in the delivering/receiving space for the wafer W is also exhausted into the drive chamber 22 through the front-side opening 231 or the delivering/receiving location-side openings 233a and 233b.

The guide plates 41a and 41b for guiding the air in the delivering/receiving space to the processing chamber-side openings 232a and 232b that are opened toward the drive chamber 22 are provided at the entrance of the processing chamber 20. Thus, the air in the delivering/receiving space begins to flow toward the processing chamber 20 depending on the movement of the wafer W when carrying the wafer W into the processing chamber 20 as shown in FIGS. 3 and 5, although the air is guided by the guide plates 41a and 41b so that the flow direction of the air is changed downward. As a result, a portion of the air to flow into the processing chamber 20 can be exhausted into the drive chamber 22 without generating a swirl in the flow of air.

In addition, the slit 234 that is opened directly toward the drive chamber 22 in the processing chamber 20 is provided with the slit-side ducts 3a and 3b, each having the exhaust port 31 formed along the lengthwise direction of the slit 234. Thus, as shown in FIGS. 5 and 6, air in the processing chamber 20, containing ozone generated due to the irradiation of ultraviolet rays, can be exhausted into the slit-side ducts 3a and 3b through the exhaust ports 31, thereby suppressing the flow of air into the drive chamber 22.

Since air in a region near and below the partition member 23 is also exhausted into the slit-side ducts 3a and 3b through the aforementioned exhaust ports 31, it is possible to suppress the flow of air containing particles into the processing chamber 20 from the drive chamber 22.

Particularly, as described above, the buffer space forming members 223a and 223b are disposed below the partition member 23, and the buffer space 224 is formed between the partition member 23 and the buffer space forming members 223a and 223b. Since the buffer space 224 is separated from the drive chamber 22 with the buffer space forming members 223a and 223b interposed therebetween, it is configured to hardly receive an influence of turbulence of the air stream in the drive chamber 22 due to the movement of the support 51 or the slider 52. As a result, the slit-side ducts 3a and 3b can stably exhaust the air stream from the lower side of the partition member 23. Moreover, since the buffer space 224 is interposed between the processing chamber 20 and the drive chamber 22, there is an advantage in that the turbulence of the air stream containing particles in the drive chamber 22 has difficulty entering the processing chamber 20 through the slits 225 and 234.

Further, since the exhaust ducts 42a and 42b are opened toward a region in which the irradiation of the ultraviolet rays from the ultraviolet lamp 7 is performed in the processing chamber 20, the air containing ozone generated in the region can be effectively exhausted outside from a position where the ozone is generated.

The air in the processing chamber 20, which flows above the guide plates 41a and 41b (the processing chamber-side openings 232a and 232b), the exhaust ducts 42a and 42b, or the slit-side ducts 3a and 3b described above, is exhausted outside through the rear exhaust part 6. The exhaust ducts 42a and 42b also serve to reduce the amount of exhaust from the processing chamber 20 by reducing the volume of the processing chamber 20.

Next, the flow of a gas in the drive chamber 22 will be described with reference to FIG. 7. As shown in FIG. 7, air flowing from the front-side opening 231, the delivering/receiving location-side openings 233a and 233b, or the processing chamber-side openings 232a and 232b, which are provided in the partition member 23, is exhausted outside through the exhaust pipes 221a and 221b respectively provided on both the left and right surfaces of the drive chamber 22 when viewed from the front side. The plurality of exhaust holes 222 are formed in a spaced-apart relationship with each other in each of the exhaust pipes 221a and 221b.

As a result, air streams directed to both the left and right surfaces from a central portion when viewed from the front side are equally produced along the front-back direction (the direction in which the aforementioned slit 234 is formed) in the drive chamber 22. For this reason, the occurrence of a swirling air stream containing particles can be decreased in the drive chamber 22, thereby suppressing particles from entering the processing chamber 20 through the slit 234.

In addition, even when some of the air in the processing chamber 20 may not be completely exhausted from the slit-side ducts 3a and 3b so that air containing ozone may enter the drive chamber 22 through the slit 234, an air stream flowing away from the drive mechanism (the slider 52, the rail 53, the drive belt 541 or rotary motor 543, and the pulley 542) is always produced in the drive chamber 22. For this reason, the air containing ozone can be kept in the vicinity of the drive mechanism, thereby suppressing the occurrence of corrosion of the mechanism.

Next, the nitric UV processing module 144 according to a second embodiment of the present disclosure will be described with reference to FIGS. 8 to 11. In these figures, common components to the atmospheric UV processing module 141 described with reference to FIGS. 2 to 7 are designated by reference numerals identical to those used in these figures. Since the configuration of the drive chamber 22 is similar to the example shown in FIGS. 4 and 7, repeated illustration thereof will be omitted.

The configuration of the nitric UV processing module 144 for performing UV processing (nitric UV processing) on a wafer W in a nitric atmosphere is different from that of the atmospheric UV processing module 141 previously described above in that nitrogen gas supplying pipes 32a and 32 for supplying nitrogen gas into the processing chamber 20 are provided, in that since a trace of ozone is generated in the processing chamber 20, the exhaust of the processing chamber 20 is performed only through the slit-side ducts 3a and 3b with the exhaust ducts 43a and 43b extending to the entrance of the processing chamber 20, and in that a gas curtain of the nitrogen gas is formed downward from the covering portion 73 in order to suppress entry of air into the processing chamber 20.

The nitrogen gas supplying pipes 32a and 32b are connected to a nitrogen supplying source (not shown) and installed to extend in the front-back direction along inner wall surfaces of the processing chamber 20. A plurality of nitrogen gas supplying holes 321 are disposed in a spaced-apart relationship with each other in the top surface of each of the nitrogen gas supplying pipes 32a and 32b. That is, the nitrogen gas supplying holes 321 may be considered to be formed in the direction to which the slit 234 extends, at left and right peripheries of the processing chamber 20 with the slit 234 interposed therebetween.

Figure 10:
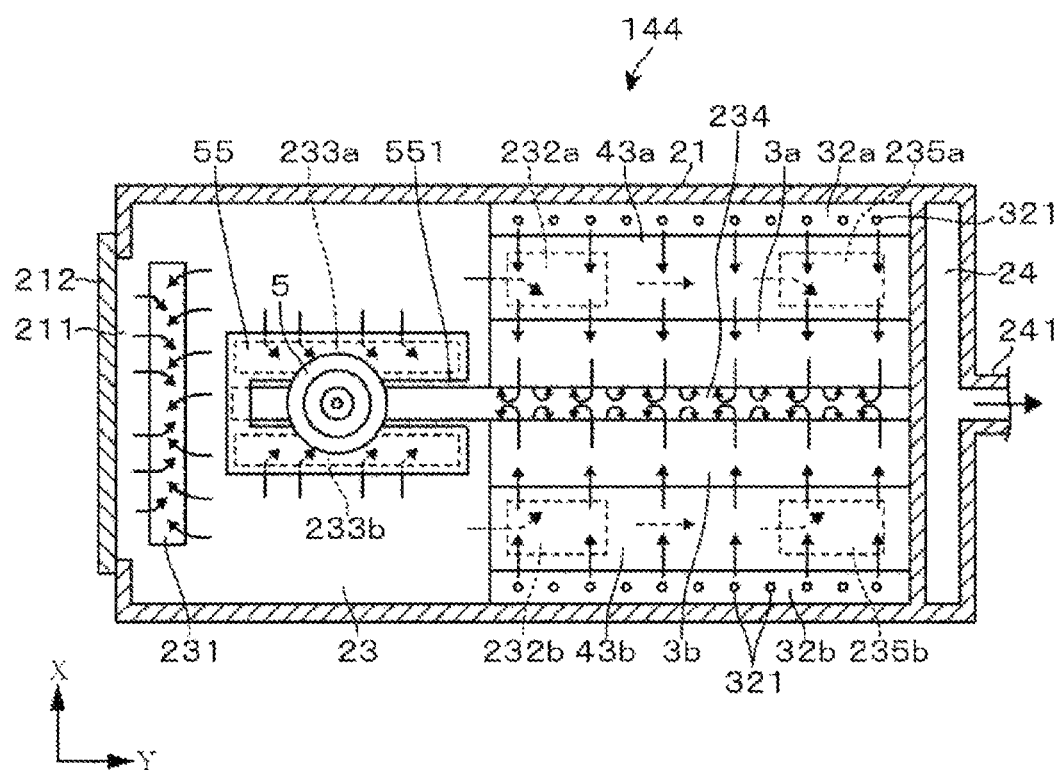
FIG. 10 is a first cross-sectional plan view of the nitric UV processing module.
Figure 11:
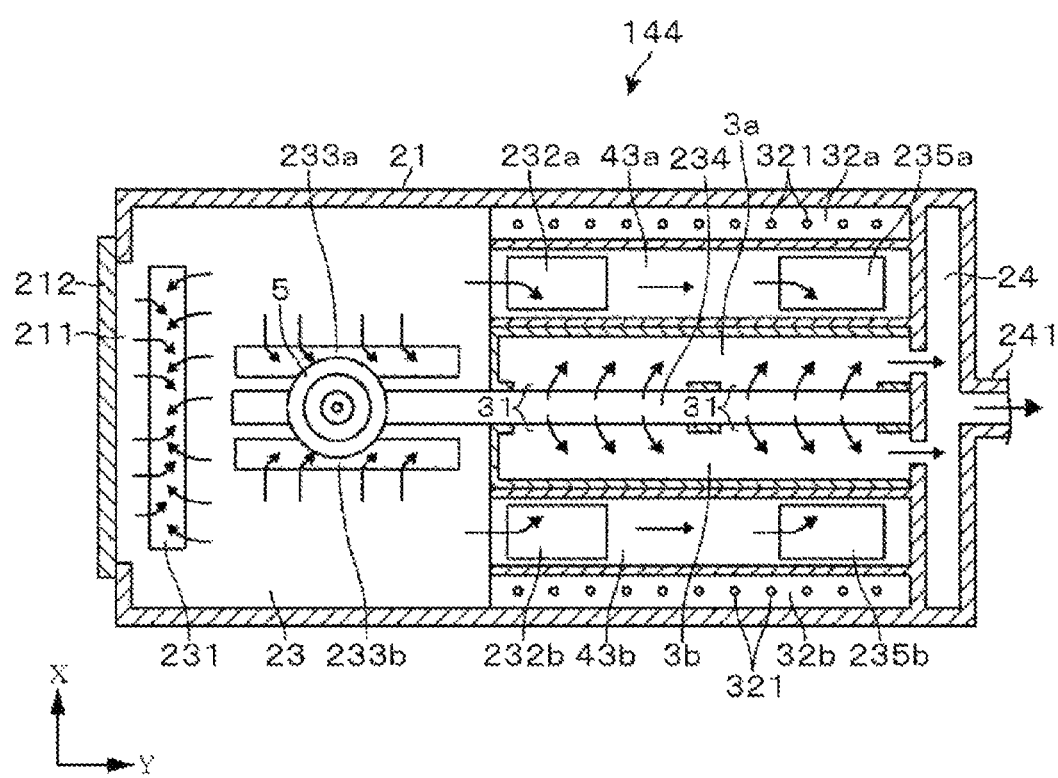
FIG. 11 is a second cross-sectional plan view of the nitric UV processing module.
Figure 12:
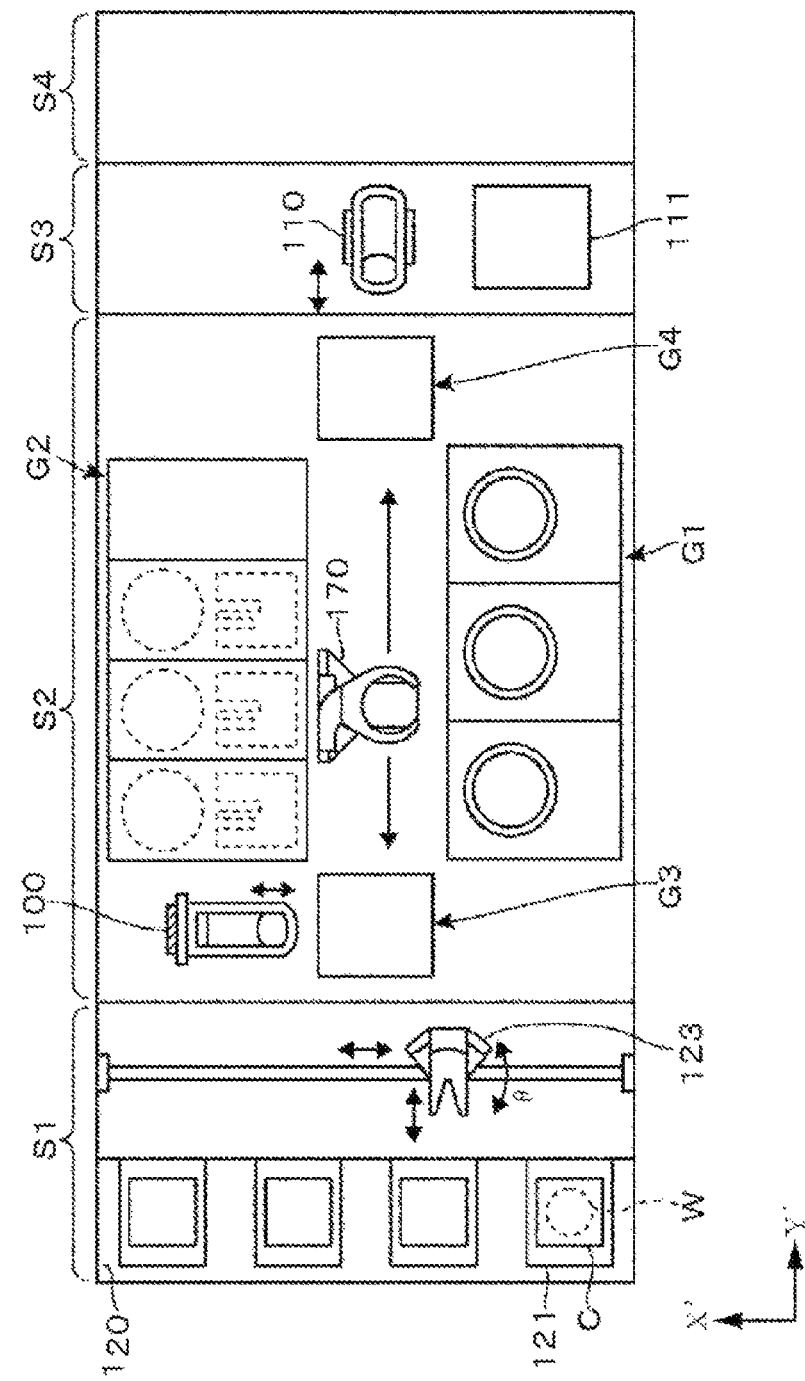
FIG. 12 is a cross-sectional plan view of an applying and developing apparatus for forming a pattern using the DSA.
Figure 13:
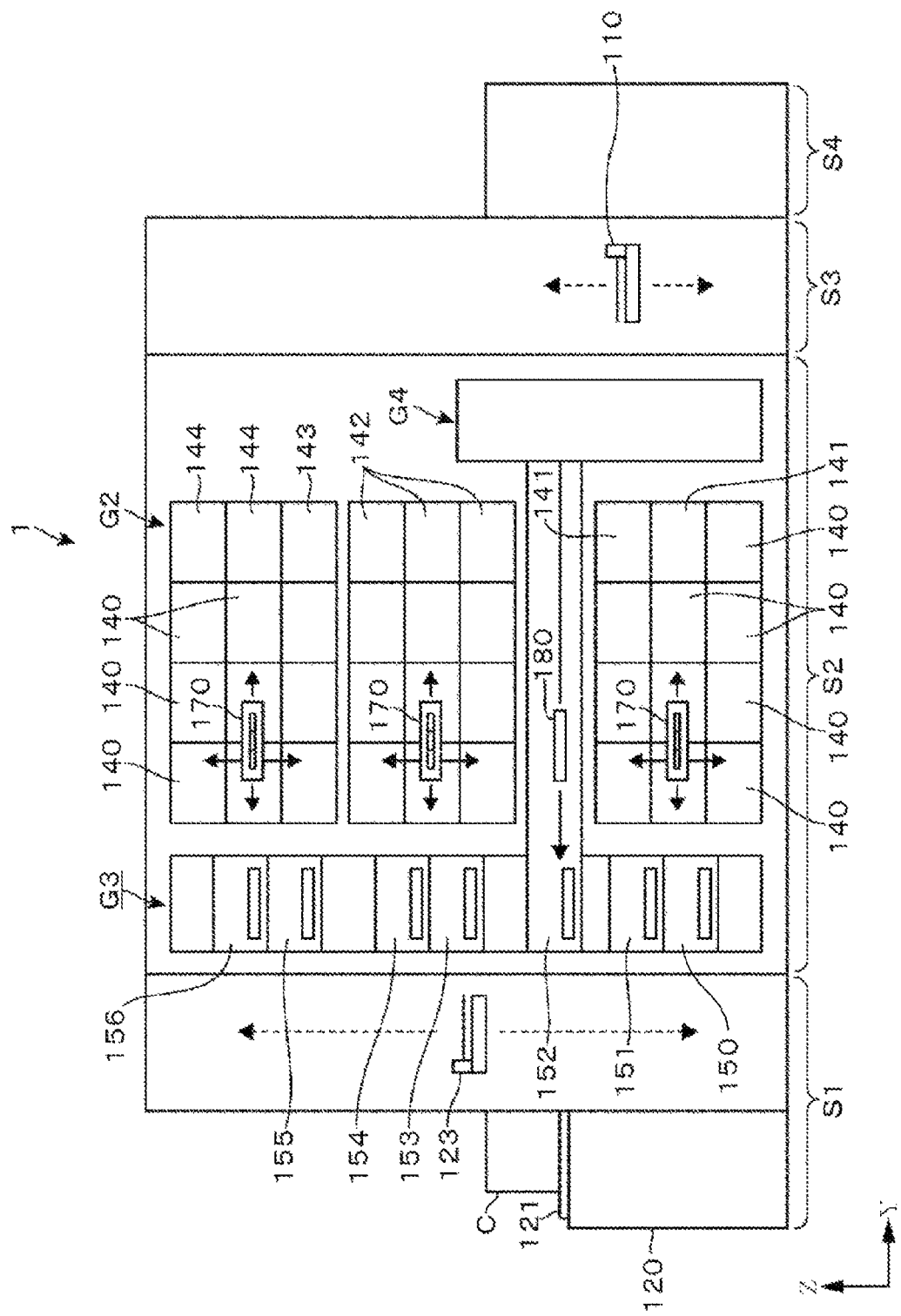
FIG. 13 is a first longitudinal sectional side view of the applying and developing apparatus.

As shown in FIGS. 10 and 11, the nitrogen gas supplied through the nitrogen gas supplying holes 321 is guided by a ceiling surface of the processing chamber 20 (a bottom surface of the sheet of quartz glass 71 or the processing chamber cover 74), so that the flow direction of the nitrogen gas is diverted to a central portion of the processing chamber 20 and the nitrogen gas is then exhausted outside through the exhaust ports 31 of the slit-side ducts 3a and 3b formed along the slit 234. The nitrogen gas supplying pipes 32a and 32b correspond to a gas supplying unit of an inert gas.

Even in this embodiment, the slit-side ducts 3a and 3b, each of which has the exhaust port 31 formed along the slit 234, inhibits a trace of ozone generated in the processing chamber 20 from entering the drive chamber 22 and inhibits particles generated in the drive chamber 22 from entering the processing chamber 20.

In the nitric UV processing module 144 of this embodiment, the rear exhaust part 6 is not provided at the rear end of the processing chamber 20.

In the example illustrated in FIG. 9, although the buffer space forming members 223a and 223b are not provided below the partition member 23, similarly to the atmospheric UV processing module 141 according to the first embodiment shown in FIG. 3, the buffer space forming members 223a and 223b may be disposed below the partition member 23 to form the buffer space 224, thereby suppressing the influence of turbulence of the air stream in the drive chamber 22.

Furthermore, the exhaust ducts 43a and 43b extending in the front-back direction in a region ranging from the front end to the rear end of the processing chamber 20 are respectively provided next to the left side of the slit-side duct 3a and the right side of the slit-side duct 3b when viewed from the front side. The respective exhaust ducts 43a and 43b are provided to cover the processing chamber-side openings 232a and 232b provided at the same positions as those in the atmospheric UV processing module 141 previously described above, and rear openings 235a and 235b formed in the partition member 23 located at a rear side of the processing chamber-side openings 232a and 232b. In this embodiment, the rear openings 235a and 235b correspond to openings at rear ends of the exhaust ducts 43a and 43b, respectively, and the processing chamber-side openings 232a and 232b correspond to the first openings.

Figure 9:
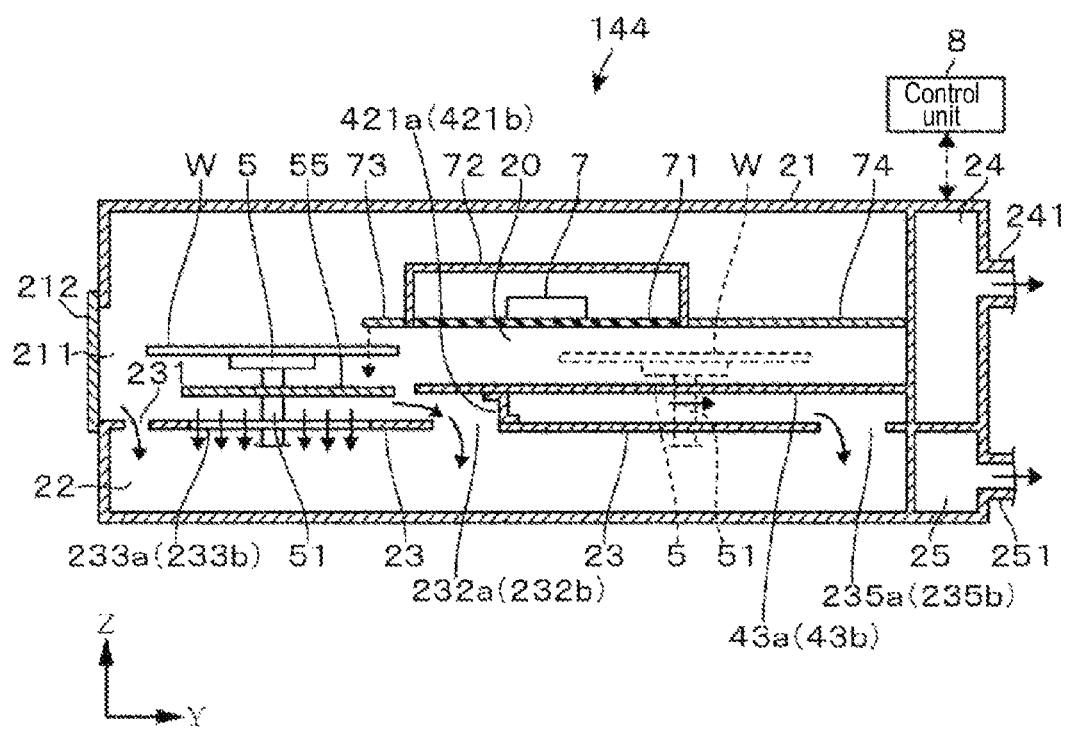
FIG. 9 is a longitudinal sectional side view of the nitric UV processing module.

As shown in FIG. 9, guide members 421a and 421b for blocking portions of the interiors of the exhaust ducts 43a and 43b are provided at positions of rear ends of the processing chamber-side openings 232a and 232b in order to guide some of the air streams flowing into the exhaust ducts 43a and 43b toward the processing chamber-side openings 232a and 232b, respectively.

Alternatively, the aforementioned rear openings 235a and 235b may not be necessarily provided. In this case, the exhaust ducts 43a and 43b may be blocked by the guide members 421a and 421b at the rear ends of the processing chamber-side openings 232a and 232b, respectively.

Leading ends of the exhaust ducts 43a and 43b that serve as third exhaust ports are opened at positions facing the delivering/receiving space for the wafer W from the processing chamber 20. Thus, even though air in the delivering/receiving space begins to flow toward the processing chamber 20 depending on the movement of the wafer W upon transfer of the wafer W into the processing chamber 20, a portion of the air enters the exhaust ducts 43a and 43b through the openings, and is then exhausted into the drive chamber 22 through the processing chamber-side openings 232a and 232b and the rear openings 235a and 235b. As a result, a portion of the air that tends to enter the processing chamber 20 can be exhausted into the drive chamber 22 without generating swirl of an air stream, or the like.

Even in this embodiment, the exhaust ducts 43a and 43b also serve to reduce the volume of the processing chamber 20, thereby reducing the amount of exhaust from the processing chamber 20.

As shown in FIG. 9, the nitrogen gas is discharged downward from an entire edge of the covering portion 73 provided in the front of the lamp box 72 in order to form a gas curtain, which suppresses the entry of air into the processing chamber 20, thereby suppressing the amount of ozone generated depending on the irradiation of ultraviolet rays.

The nitric UV processing module 144 is configured to have a nitrogen gas atmosphere. Hence, when a wafer W is transferred to the processing chamber 20 in which the concentration of oxygen is low, for example, a few hundreds ppm or less, and irradiated with ultraviolet rays, the nitric UV processing described with reference to FIG. 1C is performed.

With the atmospheric UV processing module 141 and the nitric UV processing module 144 according to the embodiments described above, there are the following effects. The atmospheric UV processing module 141 and the nitric UV processing module 144 are configured such that the vacuum chuck 5 having the wafer W mounted thereon is movable in the front-back direction between the delivering/receiving location for the wafer W and the processing chamber 20 by the drive mechanism in the drive chamber 22 below the vacuum chuck 5. The partition member 23 having the slit 234 for allowing the movement of the support 50 of the vacuum chuck 5 partitions the processing chamber 20 and the drive chamber 22 up and down. The interior of the drive chamber 22 is exhausted by the exhaust holes 222 (first exhaust ports) formed in the drive chamber 22, and the interiors of the drive chamber 22 and the processing chamber 20 are also exhausted by the exhaust ports 31 (second exhaust ports) facing the slit 234. For this reason, even though the slit exists in the partition member 23, there are effects of the suppression of inflow of particles from the drive chamber 22 into the processing chamber 20 and inflow of ozone from the processing chamber 20 into the drive chamber 22.

Here, the configurations of the atmospheric UV processing module 141 and the nitric UV processing module 144 are not limited to the examples shown in FIGS. 2 to 11, and the installation of a portion of the front-side opening 231 or delivering/receiving location-side openings 233a and 233b, an exhaust mechanism comprised of the processing chamber-side openings 232a and 232b and the guide plates 41a and 41b, or the exhaust ducts 42a, 42b, 43a and 43b may be omitted. Furthermore, the exhaust method for the interior of the drive chamber 22 is not limited to the examples shown in FIGS. 4 and 7, and the exhaust may be performed by connecting the lower-side exhaust line 251 directly to a rear wall surface of the drive chamber 22.

Next, an operation of processing wafers W using a coating and developing apparatus 1 having the atmospheric UV processing module 141 and the nitric UV processing module 144 described above will be outlined with reference to FIGS. 12 to 14.

When a cassette C with wafers W accommodated therein is carried into a carrier block S1 of the coating and developing apparatus 1, each of the wafers W is sequentially taken out by a wafer transfer module 123 and transferred to a delivering/receiving module 153 in a shelf unit G3.

Then, the wafer W is transferred to a heat treatment module 140 so as to adjust the temperature of the wafer W, and the wafer W is transferred to an anti-reflection film forming module 132 to form an anti-reflection film thereon. Subsequently, the wafer W with the temperature adjusted in the heat treatment module 140 is transferred to a neutral film forming module 133 to thereby form a neutral film 91 shown in FIG. 1A. Thereafter, the wafer W with the temperature adjusted in the heat treatment module 140 returns to the delivering/receiving module 153 in the shelf unit G3.

Next, the wafer W is transferred to a delivering/receiving module 154 by a wafer transfer module 100 and then transferred to an adhesion module 142 where the wafer W is subjected to adhesion processing. Thereafter, the wafer W is transferred to a resist coating module 134 so that a resist solution is coated on the wafer W, resulting in formation of a resist film. Subsequently, the wafer W is transferred to the heat treatment module 140, subjected to pre-bake processing, and then transferred to a delivering/receiving module 155 of the shelf unit G3.

Next, the wafer W is transferred to a peripheral exposure module 143, subjected to peripheral exposure processing, and then transferred to a delivering/receiving module 156 of the shelf unit G3. Thereafter, the wafer W is transferred to a delivering/receiving module 152 by the wafer transfer module 100 and then transferred to a delivering/receiving module 162 of a shelf unit G4 by a shuttle carrying module 180.

Subsequently, the wafer W is transferred to an exposure device S4 by a wafer transfer module 110 of an interface block S3 and subjected to exposure processing. The wafer W that has been subjected to the exposure processing is transferred from the exposure device S4 to a delivering/receiving module 160 by the wafer transfer module 110. Then, the wafer W is exposed and then subjected to bake processing in the heat treatment module 140.

Continuously, the wafer W is transferred to a developing module 130 and then developed, and subsequently subjected to post-bake processing in the heat treatment module 140, thereby forming a resist film 92 patterned as shown in FIG. 1A.

The wafer W on which the patterned resist film 92 is formed is transferred to the atmospheric UV processing module 141 where the atmospheric UV processing shown in FIG. 1A is performed. The wafer W with hydrophilic regions 911 formed in the neutral film 91 by the atmospheric UV processing is transferred to a cleaning module 131, so that the resist film 92 is removed by supplying an organic solvent onto the wafer W.

Next, the wafer W transferred to the delivering/receiving module 155 of the shelf unit G3 by the wafer transfer module 100 and then to a block copolymer coating module 135. In the block copolymer applying module 135, BCP is coated (FIG. 1B), and heat treatment is continuously performed at a predetermined temperature in the heat treatment module 140, so that a BCP film 93 is phase-separated into hydrophilic polymer portions 931 and hydrophobic polymer portions 932.

Thereafter, the wafer is transferred to the nitric UV processing module 144 where nitric UV processing shown in FIG. 1C is performed. Continuously, the wafer W is transferred to a delivering/receiving module 151 of the shelf unit G3 and then carried into the cleaning module 131. An organic solvent is supplied onto the wafer W to remove the hydrophilic polymer portions 932, resulting in a pattern of the hydrophobic polymer portions 923.

Subsequently, the wafer W is transferred to a delivering/receiving module 150 and then carried in the cassette C on a predetermined cassette mounting plate 121 by the wafer transfer module 123 of the carrier block S1.

Although the embodiments of the present disclosure have been described above, the present disclosure in which the interior of the apparatus is exhausted through the exhaust ports 31 (second exhaust ports) formed along the slit for allowing the movement of the support supporting the mounting table with the wafer W mounted thereon, or through the exhaust holes 222 (first exhaust ports) formed in the drive chamber 22 is not limited to applications to the atmospheric UV processing module 141 or the nitric UV processing module 144 described above. For example, the present disclosure may be applied to the peripheral exposure module 143 previously described above.

Furthermore, there has been proposed a technique in which a polystyrene film, for example, instead of the hydrophilic regions 911 in the neutral film 91, is irradiated with ultraviolet rays in an inert gas atmosphere to perform a cross-linking reaction, the cured polystyrene film is patterned using an etching device, and the neutral film 91 is then embedded between patterns of the polystyrene film, thereby controlling the formed position of the pattern such that the hydrophobic polymer portions 932 are disposed using, as a reference point, a position at which the polystyrene film remains. The present disclosure may be applied to a module for irradiating the polystyrene film with ultraviolet rays in this technique. Of course, the present disclosure may be applied to the technique of modifying a resist film described in the section of BACKGROUND herein.

According to the present disclosure, the mounting table for a substrate is configured to be movable in the front-back direction between the delivering/receiving location for the wafer W and the processing chamber by the drive mechanism in the drive chamber below the mounting table. The processing chamber and the drive chamber are partitioned up and down by the partition member having the slit for allowing the movement of the support of the mounting table. The interior of the drive chamber is exhausted by the first evacuation ports formed in the drive chamber, and the interiors of the drive chamber and the processing chamber are also exhausted by the second exhaust ports facing the slit. For this reason, even though the slit exists in the partition member, there are effects of the suppression of inflow of particles from the drive chamber into the processing chamber and inflow of ozone from the processing chamber into the drive chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a housing;
a mounting table provided in the housing and configured to mount a substrate thereon;
a drive mechanism provided below the mounting table so as to move the mounting table in a front-back direction between a delivering/receiving location for the substrate and a processing chamber;

an ultraviolet irradiation unit configured to irradiate the substrate in the processing chamber with ultraviolet rays;

a partition member provided to partition the processing chamber and a drive chamber with the drive mechanism positioned therein up and down, the partition member having a slit for allowing movement of a support supporting the mounting table;

first exhaust ports formed in the drive chamber to exhaust an atmosphere in the drive chamber; and second exhaust ports formed along a lengthwise direction of the slit so as to face the slit.

2. The substrate processing apparatus of claim 1, wherein the second exhaust ports are formed in surfaces opposite to each other on both left and right sides of the slit.

3. The substrate processing apparatus of claim 1, wherein a buffer space forming member is provided below the partition member located at a side of the processing chamber side with a gap with respect to a bottom surface of the partition member, and the gap constitutes a buffer space disposed between an atmosphere of the processing chamber and an atmosphere of the drive chamber.

4. The substrate processing apparatus of claim 1, wherein an exhaust duct is provided in a lower portion of the processing chamber to extend along the lengthwise direction of the slit and to have a third exhaust port formed at a front end of the exhaust duct, the front end being defined based on a direction from the delivering/receiving location for the substrate to the processing chamber, the exhaust duct configured to exhaust an air stream flowing from the third exhaust port.

5. The substrate processing apparatus of claim 4, wherein a first opening is formed in a portion of a part of the partition member corresponding to a bottom surface of the exhaust duct.

6. The substrate processing apparatus of claim 5, wherein the first opening is formed near the third exhaust port.

7. The substrate processing apparatus of claim 4, wherein a second opening is formed at a position in the partition member anterior to the front end of the exhaust duct and facing the delivering/receiving location for the substrate from the processing chamber.

8. The substrate processing apparatus of claim 4, wherein the third exhaust port is open to a region where the ultraviolet rays are radiated from the ultraviolet irradiation unit in the processing chamber.

9. The substrate processing apparatus of claim 4, wherein the third exhaust port is open to a position facing the delivering/receiving location for the substrate from the processing chamber.

10. The substrate processing apparatus of claim 1, wherein the first exhaust ports are formed on both left and right sides of the slit.

11. The substrate processing apparatus of claim 1, wherein a gas supplying unit for supplying an inert gas is provided in the processing chamber.

12. The substrate processing apparatus of claim 11, wherein the gas supplying unit has gas supply holes formed along a direction in which the slit extends, at left and right edges of the processing chamber with the slit interposed therebetween.

13. The substrate processing apparatus of claim 11, wherein a mechanism for forming a curtain of the inert gas is provided at an entrance for the substrate in the processing chamber.

14. The substrate processing apparatus of claim 1, wherein a third opening is formed at a portion of the partition member positioned closer to the delivering/receiving location for the substrate than the processing chamber.

15. The substrate processing apparatus of claim 14, wherein the third opening comprises openings formed on both left and right sides of the slit at the delivering/receiving location for the substrate, and a cover for covering the openings is provided between the openings and a level of a mounting surface of the mounting table.

* * * * *